United States Patent
Lo et al.

(10) Patent No.: US 9,196,797 B2
(45) Date of Patent: Nov. 24, 2015

(54) LIGHT EMITTING DIODE DEVICE AND FLIP-CHIP PACKAGED LIGHT EMITTING DIODE DEVICE

(71) Applicant: GENESIS PHOTONICS INC., Tainan (TW)

(72) Inventors: Yu-Yun Lo, Tainan (TW); Yi-Ru Huang, Tainan (TW); Chih-Ling Wu, Tainan (TW); Tzu-Yang Lin, Tainan (TW); Yun-Li Li, Tainan (TW)

(73) Assignee: Genesis Photonics Inc., Tainan (TW)

( * ) Notice: Subject to any disclaimer, the term of this patent is extended or adjusted under 35 U.S.C. 154(b) by 50 days.

(21) Appl. No.: 13/661,272

(22) Filed: Oct. 26, 2012

(65) Prior Publication Data

US 2013/0134464 A1    May 30, 2013

(30) Foreign Application Priority Data

Nov. 29, 2011    (TW) .............................. 100143830 A

(51) Int. Cl.
  *H01L 33/44*    (2010.01)
  *H01L 33/40*    (2010.01)
  (Continued)

(52) U.S. Cl.
  CPC .............. *H01L 33/405* (2013.01); *H01L 33/46* (2013.01); *H01L 33/42* (2013.01); *H01L 2933/0016* (2013.01)

(58) Field of Classification Search
  CPC ....... H01L 33/40; H01L 33/405; H01L 33/42; H01L 33/44; H01L 33/46
  USPC ............................................... 257/98; 438/29
  See application file for complete search history.

(56) References Cited

U.S. PATENT DOCUMENTS 7,420,222 B2 *  9/2008  Slater et al. ...................... 257/98
7,880,176 B2 *  2/2011  Seong et al. ..................... 257/79
(Continued)

FOREIGN PATENT DOCUMENTS

| CN | 1449060 | 10/2003 |
| CN | 1617365 | 5/2005 |
| CN | 1996630 | 7/2007 |

OTHER PUBLICATIONS

Chang, S. J. et al., 'Nitride-based flip-chip LEDs with transparent ohmic contacts and reflective mirrors,' 2006 IEEE Transactions on Advanced Packaging vol. 29, No. 3 pp. 403-408.*

(Continued)

*Primary Examiner* — Bryan Junge
(74) *Attorney, Agent, or Firm* — Jianq Chyun IP Office

(57) ABSTRACT

The present invention relates to a light emitting diode (LED) and a flip-chip packaged LED device. The present invention provides an LED device. The LED device is flipped on and connected electrically with a packaging substrate and thus forming the flip-chip packaged LED device. The LED device mainly has an Ohmic-contact layer and a planarized buffer layer between a second-type doping layer and a reflection layer. The Ohmic-contact layer improves the Ohmic-contact characteristics between the second-type doping layer and the reflection layer without affecting the light emitting efficiency of the LED device and the flip-chip packaged LED device. The planarized buffer layer id disposed between the Ohmic-contact layer and the reflection layer for smoothening the Ohmic-contact layer and hence enabling the reflection layer to adhere to the planarized buffer layer smoothly. Thereby, the reflection layer can have the effect of mirror reflection and the scattering phenomenon on the reflected light can be reduced as well.

34 Claims, 5 Drawing Sheets

(51) Int. Cl.
*H01L 33/46* (2010.01)
*H01L 33/42* (2010.01)

(56) References Cited

U.S. PATENT DOCUMENTS

| | | | |
|---|---|---|---|
| 7,964,889 B2* | 6/2011 | Song et al. | 257/99 |
| 8,772,804 B2* | 7/2014 | Ahlstedt et al. | 257/98 |
| 2004/0135166 A1* | 7/2004 | Yamada et al. | 257/103 |
| 2011/0049546 A1* | 3/2011 | Heikman et al. | 257/98 |
| 2011/0198640 A1 | 8/2011 | Ahlstedt et al. | |

OTHER PUBLICATIONS

Chang, C. S. et al., 'High brightness InGaN green LEDs with an ITO on n++-SPS upper contact,' 2003 IEEE Transactions on Electron Devices, vol. 50, No. 11, pp. 2208-2212.*

"Office Action of China Counterpart Application," issued on Dec. 24, 2014, p1-p8, in which the listed references were cited.

* cited by examiner

LIGHT EMITTING DIODE DEVICE AND FLIP-CHIP PACKAGED LIGHT EMITTING DIODE DEVICE

FIELD OF THE INVENTION

The present invention relates generally to a light emitting diode (LED) device, and particularly to an LED device and a flip-chip packaged LED device having excellent Ohmic-contact characteristics and light emitting efficiency.

BACKGROUND OF THE INVENTION

Electricity is an indispensable energy nowadays. No matter lighting devices, home appliances, communication apparatuses, transportation, or industrial equipment. without electricity, none can operate. Current global energy mainly comes from burning petroleum or coal. However, the supply of petroleum or coal is not inexhaustible. If people don't search actively for alternative energy, when petroleum or coal is exhausted, the world will encounter energy crisis. For solving the problem of energy crisis, in addition to developing positively various kinds of renewable energy, it is required to save energy and use energy efficiently for improving the usage efficiency of energy.

Take lighting equipment as an example. Light equipment is indispensable in human lives. As technologies develop, lighting tools having better luminance and more power saving are gradually provided. Currently, an emerging light source is LED. In comparison with light sources according to prior art, LEDs have the advantage of small size, power saving, good light emitting efficiency, long lifetime, fast response time, no thermal radiation, and no pollution of poisonous materials such as mercury. Thereby, in recent years, the applications of LEDs are wide-spreading. In the past, the brightness of LEDs still cannot replace the light sources according to the prior art. As the technologies advance, high-luminance LEDs (high-power LEDs) are developed recently and sufficient to replace the light sources according to the prior art.

The epitaxial structure of LED is composed of semiconductor layers of p-type and n-type gallium-nitride family and light emitting layers. The light emitting efficiency of LED is determined by the quantum efficiency of the light emitting layer as well as the extraction efficiency of the LED. The method for increasing the quantum efficiency is mainly to improve the epitaxial quality and the structure of the light emitting layer; the key to increasing the extraction efficiency is to reduce the energy loss caused by reflection of the light emitted by the light emitting layer within the LED.

Depending on the property of the material of the p-type semiconductor layer and the work function of the metal used as the reflection layer, an Ohmic-contact or a Schottky contact is formed between the p-type semiconductor layer and the reflection layer of a general LED. When the resistance of an Ohmic-contact is too high, the operating characteristics of LED will be affected. It is thereby required to lower the resistance of the Ohmic-contact. The Ohmic-contact characteristics between the p-type semiconductor layer and the reflection layer can be improved by disposing an Ohmic-contact layer therebetween. The Ohmic-contact layer according to the prior art adopts a Ni/Au Ohmic-contact layer and heat treatment is performed on the Ohmic-contact layer for forming a good Ohmic-contact. Nonetheless, the light absorption rate of the Ni/Au Ohmic-contact layer is higher. Besides, the interface between the p-type semiconductor layer and the Ni—Au Ohmic-contact layer is roughened due to the heat treatment and leading to inability in reflecting light. Consequently, the reflection efficiency of the LED will be reduced.

For solving the problems described above, please refer to FIG. 1, which shows a structure diagram of the LED device according to the prior art. As shown in the figure, an Ohmic-contact layer 11' is disposed between the p-type semiconductor layer 10' and the reflection layer 12'. The Ohmic-contact layer 11' uses a single-layer metal-oxide layer and has high electrical conductivity. Although the Ohmic-contact layer 11' has high electrical conductivity, it lowers the light transmittance, and hence leading to lowering of the light emitting efficiency of the LED. If the Ohmic-contact layer 11' has high light transmittance, its electrical conductivity will be reduced, making the Ohmic-contact characteristics of the Ohmic-contact layer 11' inferior. Thereby, the Ohmic-contact layer 11' according to the prior art, which adopts a single-layer metal-oxide layer, cannot have good Ohmic-contact characteristics while maintaining superior light emitting efficiency.

Accordingly, the present invention provides an LED device and a flip-chip packaged LED device having excellent Ohmic-contact characteristics as well as superior light emitting efficiency.

SUMMARY

An objective of the present invention is to provide an LED device. The LED device can enhance its Ohmic-contact characteristics effectively while maintaining superior light emitting efficiency.

An LED device according to a preferred embodiment of the present invention comprises a device substrate, a first-type doping layer, a light emitting layer, a second-type doping layer, an Ohmic-contact layer, a planarized buffer layer, a reflection layer, and two electrodes. The first-type doping layer is disposed on the device substrate; the light emitting layer is disposed on the first-type doping layer; the second-type doping layer is disposed on the light emitting layer; the Ohmic-contact layer is disposed on the second-type doping layer; the planarized buffer layer is disposed on the Ohmic-contact layer; the reflection layer is disposed on the planarized buffer layer; and the two electrodes are disposed on the reflection layer and the first-type doping layer, respectively.

According to the present invention, the highly conductive Ohmic-contact layer is used for giving good current conduction between the second-type doping layer and the reflection layer of the LED device and thus improving the Ohmic-contact characteristics of the LED device. In addition, the present invention further uses the planarized buffer layer disposed between the Ohmic-contact layer and the reflection layer for making the surface of the Ohmic-contact layer smooth, which facilitates smooth adhesion of the reflection layer to the planarized buffer layer as well as reducing the scattering phenomenon of the reflected light. Thereby, superior light emitting efficiency can be achieved.

Moreover, the present invention further provides a flip-chip packaged LED device. The flip-chip packaged LED device according to a preferred embodiment of the present invention comprises a packaging substrate and an LED device. The LED device is flipped on and connected electrically with the packaging substrate. The LED device comprises a device substrate, a first-type doping layer, a light emitting layer, a second-type doping layer, an Ohmic-contact layer, a planarized buffer layer, a reflection layer, and two electrodes. The first-type doping layer is disposed on the device substrate; the light emitting layer is disposed on the first-type doping layer; the second-type doping layer is disposed on the light emitting layer; the Ohmic-contact layer is disposed on the second-type doping layer; the planarized buffer layer is disposed on the Ohmic-contact layer; the reflection layer is disposed on the planarized buffer layer; and the two electrodes are disposed on the reflection layer and the first-type doping layer, respectively.

The flip-chap packaged LED device according to the present invention uses an LED device having excellent Ohmic-contact characteristics and light emitting efficiency. The LED device s flipped on and connected electrically with the packaging substrate. By taking advantage of the high heat dissipating capability of the packaging substrate, the heat generated by the LED device can be transferred outwards and dissipated directly from the packaging substrate. Thereby, the packaged device can have superior heat dissipating effect and thus enhancing the overall performance.

DETAILED DESCRIPTION

In order to make the structure and characteristics as well as the effectiveness of the present invention to be further understood and recognized, the detailed description of the present invention is provided as follows along with embodiments and accompanying figures.

Figure 1:
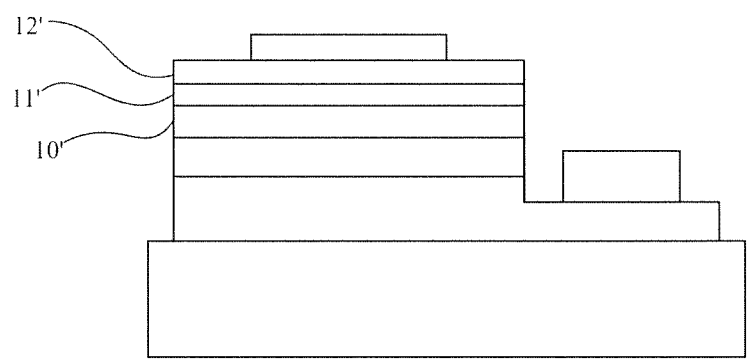
FIG. 1 shows a structure diagram of the LED device according to the prior art.
Figure 2:
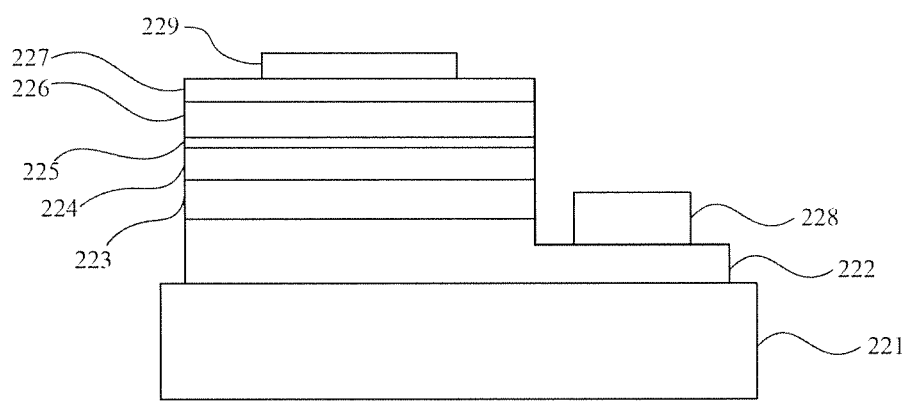
FIG. 2 shows a structure diagram according to a preferred embodiment of the present invention.

FIG. 2 shows a structure diagram according to a preferred embodiment of the present invention. As shown in the figure, the present embodiment provides an LED device 22, which comprises a device substrate 221, a first-type doping layer 222, a light emitting layer 223, a second-type doping layer 224, an Ohmic-contact layer 225, a planarized buffer layer 226, a reflection layer 227, and two electrodes 228, 229. The first-type doping layer 222 is disposed on the device substrate 221; the light emitting layer 223 is disposed on the first-type doping layer 222; and the second-type doping layer 224 is disposed on the light emitting layer 223. According to the present embodiment, the first-type doping layer 222 is an n-type semiconductor layer, and the second-type doping layer 224 is a p-type semiconductor layer. Besides, the Ohmic-contact layer 225 is a metal thin film or a metal-oxide layer with light transmittance higher than 90% and thickness less than 5000 angstroms (Å). The metal thin film can be composed by gold, nickel, platinum, aluminum, chrome, tin, indium, and their mixtures or alloys. The metal-oxide layer is chosen from the group consisting of indium-tin oxide, cerium-tin oxide, antimony-tin oxide, indium-zinc oxide, and zinc oxide.

Besides, the planarized buffer layer 226 is disposed on the Ohmic-contact layer 225. The planarized buffer layer 226 is a metal-oxide layer with light transmittance greater than 95%; the metal-oxide layer is chosen from the group consisting of indium-tin oxide, cerium-tin oxide, antimony-tin oxide, indium-zinc oxide, and zinc oxide. The reflection layer 227 is disposed on the planarized buffer layer 226. The root-mean-square roughness of the surface between the planarized buffer layer 226 and the reflection layer 227 is less than 20 Å. The reflection layer 227 is chosen from the group consisting of silver, gold, aluminum, and copper. Finally, the two electrodes 228, 229 are disposed on the first-type doping layer 222 and the reflection layer 227, respectively.

Figure 3:
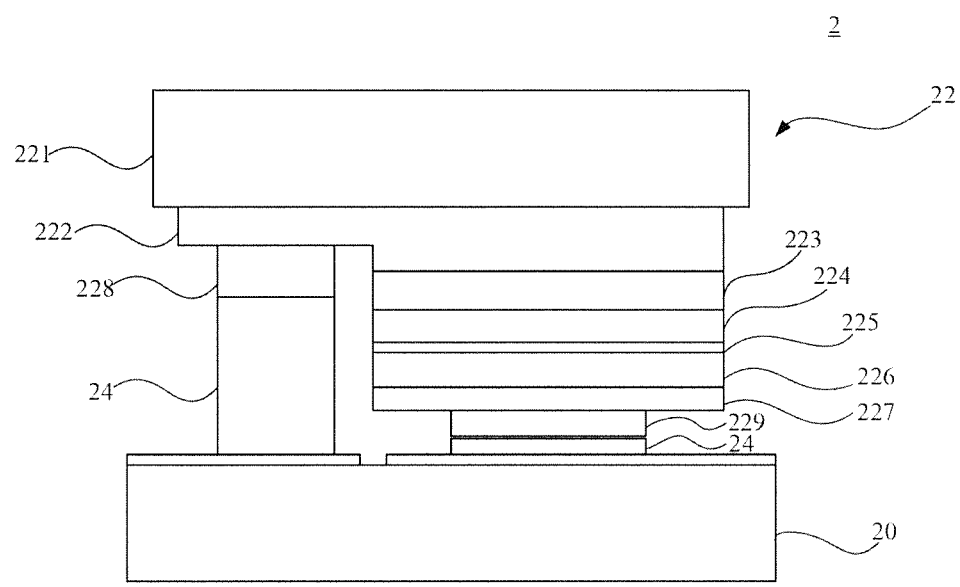
FIG. 3 shows a structure diagram according to another preferred embodiment of the present invention.

FIG. 3 shows a structure diagram according to another preferred embodiment of the present invention. As shown in the figure, the LED device 22 according to the above embodiment is used in a flip-chip packaged LED device 2, which comprises a packaging substrate 20 and the LED device 22. The LED device 22 is flipped on and connected electrically with the packaging substrate 20. The LED device 22 is connected electrically with the packaging substrate 20 by a eutectic structure 24.

The Ohmic-contact characteristics between the second-type doping layer 224 and the reflection layer 227 in the above embodiment is enhanced mainly by means of the Ohmic-contact layer 225. Because the Ohmic-contact layer 225 has high electrical conductivity, the current conduction between the second-type doping layer 224 and the reflection layer 227 can be improved effectively, and thus enhancing the Ohmic-contact characteristics between the second-type doping layer 224 and the reflection layer 227.

Because the Ohmic-contact layer 225 has high electrical conductivity, its light transmittance is lowered. In order to maintain the light transmittance of the Ohmic-contact layer 225, its thickness is less than 5000 Å. Thereby, the light emitted by the light emitting layer 223 will not be absorbed too much by the Ohmic-contact layer 225, and hence enabling the light emitting efficiency of the LED device unaffected.

Because the thickness of the Ohmic-contact layer 225 is very thin, its surface is relatively rougher. For avoiding the scattering phenomenon on the reflected light produced by the surface of the Ohmic-contact layer 225, according to the present embodiment, the planarized buffer layer 226 is used for mending the surface of the Ohmic-contact layer 225. The thickness of the planarized buffer layer 226 is between 500 to 5000 Å for reducing effectively the scattering phenomenon on the reflected light produced by the surface of the Ohmic-contact layer 225. The root-mean-square roughness of the surface between the planarized buffer layer 226 and the reflection layer 227 is less than 20 Å for adhering the reflection layer 227 smoothly to the planarized buffer layer 226. In addition, the reflection layer 227 can have the effect of mirror reflection by means if the planarized buffer layer 226.

The thickness of the Ohmic-contact layer 225 according to the present embodiment is thinner with light transmittance greater than 90%. Thereby, the light emitted by the light emitting layer 223 will not be absorbed too much by the Ohmic-contact layer 225; most of the light can transmit the Ohmic-contact layer 225. Besides, the light transmittance of the planarized buffer layer 226 is higher than 95%. Most of the light can transmit the planarized buffer layer 226 and reach the reflection layer 227. Hence, the light emitting efficiency of the LED device 22 will not be affected.

By comparing the present invention with the prior art, it is known that according to the prior art, only the Ohmic-contact layer, which is a single-layer metal-oxide layer, is disposed between the reflection layer and the second-type doping layer. By making the Ohmic-contact layer highly electrically conductive, its light transmittance will be lowered, leading to reduction in the light emitting efficiency of the LED device, which, in turn, lowers the light emitting efficiency of the flip-chip packaged LED device. If the Ohmic-contact layer is thinned, its surface will be rough, resulting in scattering of the reflected light. The LED device 22 according to the present invention adopts the planarized buffer layer 226 disposed on the thin Ohmic-contact layer 225 for reducing the scattering phenomenon on the reflected light owing to the surface of the Ohmic-contact layer 225. In addition, the Ohmic-contact layer 225 according to the present embodiment can make the Ohmic-contact characteristics between the second-type doping layer 224 and the reflection layer 227 superior without affecting the light emitting efficiency of the LED device 22. Accordingly, the light emitting efficiency of the flip-chip packaged LED device 2 will not be affected either.

Figure 4:
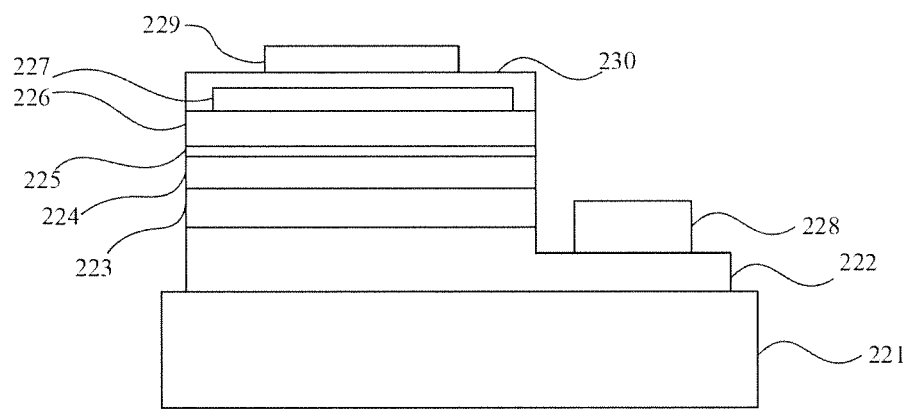
FIG. 4 shows a structure diagram according to another preferred embodiment of the present invention.

FIG. 4 shows a structure diagram according to another preferred embodiment of the present invention. As shown in the figure, in addition to the embodiment shown in FIG. 2, the LED device 22 further comprises a cover layer 230 disposed between the reflection layer 227 and the electrode 229 and extending to the sidewall of the reflection layer 227. The cover layer 230 is used for prevent the migration phenomenon of the metal ions in the reflection layer 227.

Figure 5:
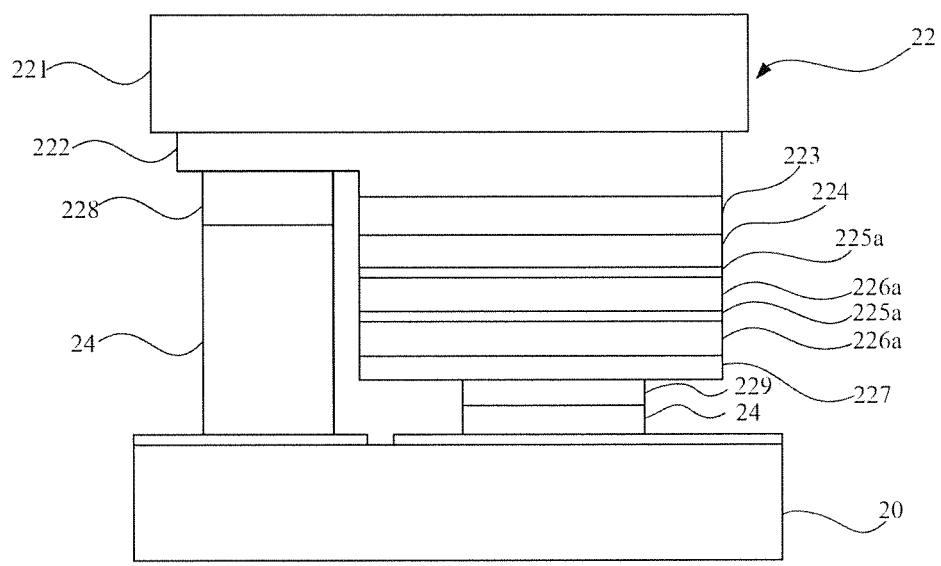
FIG. 5 shows a structure diagram according to another preferred embodiment of the present invention.

FIG. 5 shows a structure diagram according to another preferred embodiment of the present invention. As shown in the figure, the present embodiment provides another LED device 22. The difference between the LED device 22 and the one in FIG. 2 is that the LED device 22 according to the present embodiment has a plurality of Ohmic-contact layers 225a and a plurality of planarized buffer layers 226a stacked together. Each Ohmic-contact layer 225a has the characteristics of high electrical conductivity and high refractivity. Thereby, before part of the light emitted by the light emitting layer 223 reaches the reflection layer 227, the light has already been refracted by the plurality of Ohmic-contact layers 225a for enhancing the light emitting efficiency of the flip-chip packages LED device 2. Besides, the plurality of planarized buffer layers 226a have the effect of smoothening each Ohmic-contact layer 225a. Hence, the scattering phenomenon on the reflected light caused by the surface of each Ohmic-contact layer 225a can be avoided.

To sum up, the present invention provides an LED device and a flip-chip packages LED device. The LED device is flipped on and connected electrically with the packaging substrate and thus forming the flip-chip packaged LED device. The LED device has the Ohmic-contact layer and the planarized buffer layer. The Ohmic-contact layer enhances the current conduction between the second-type doping layer and the reflection layer and thus improving the Ohmic-contact characteristics of the LED device. The planarized buffer layer smoothens the surface of the Ohmic-contact layer, which enables the reflection layer to attach to the planarized buffer layer smoothly and achieving the effect of mirror reflection as well as reducing the scattering phenomenon of the reflected light. By disposing the Ohmic-contact layer and the planarized buffer layer, the LED device and the flip-chip packages LED device according to the present invention can have superior Ohmic-contact characteristics without affecting the light emitting efficiency thereof.

Accordingly, the present invention conforms to the legal requirements owing to its novelty, nonobviousness, and utility. However, the foregoing description is only embodiments of the present invention, not used to limit the scope and range of the present invention. Those equivalent changes or modifications made according to the shape, structure, feature, or spirit described in the claims of the present invention are included in the appended claims of the present invention.

The invention claimed is:

1. A light emitting diode device, comprising:
   a device substrate;
   a first-type doping layer, disposed on said device substrate;
   a light emitting layer, disposed on said first-type doping layer;
   a second-type doping layer, disposed on said light emitting layer;
   a plurality of Ohmic-contact layers and a plurality of planarized buffer layers, disposed on said second-type doping layer, said Ohmic-contact layers and said planarized buffer layers being stacked together, said planarized buffer layers being configured for mending said Ohmic-contact layers;
   a reflection layer, disposed on said stacked layers of Ohmic-contact layers and said planarized buffer layers; and
   two electrodes, disposed on said reflection layer and said first-type doping layer, respectively.

2. The light emitting diode device of claim 1, wherein said reflection layer has the effect of mirror reflection by means of said planarized buffer layer.

3. The light emitting diode device of claim 1, wherein said first-type doping layer is an n-type semiconductor layer, and said second-type doping layer is a p-type semiconductor layer.

4. The light emitting diode device of claim 1, wherein said Ohmic-contact layers are metal thin films or metal-oxide layers.

5. The light emitting diode device of claim 1, wherein the light transmittance of said Ohmic-contact layers are greater than 90%.

6. The light emitting diode device of claim 1, wherein the thickness of said Ohmic-contact layers are smaller than 5000 angstroms.

7. The light emitting diode device of claim 1, wherein said planarized buffer layers are metal-oxide layers with light transmittance greater than 95%.

8. The light emitting diode device of claim 7, wherein the metal oxide is chosen from one of the group consisting of indium-tin oxide, cerium-tin oxide, antimony-tin oxide, indium-zinc oxide, and zinc oxide.

9. The light emitting diode device of claim 1, wherein the root-mean-square roughness of the surface between said planarized buffer layers and reflection layer is less than 20 angstroms.

10. The light emitting diode device of claim 1, wherein the thickness of the planarized buffer layers are between 500 and 5000 angstroms.

11. The light emitting diode device of claim 1, wherein said reflection layer is chosen from the group consisting of silver, gold, aluminum, and copper.

12. The light emitting diode device of claim 1 further comprising a cover layer disposed on said reflection layer and extending to the sidewall of said reflection layer.

13. A flip-chip packaged light emitting diode device, comprising:
   a packaging substrate;
   a light emitting diode device, flipped on and connected electrically with said packaging substrate, and said light emitting diode device comprising:
   a device substrate;
   a first-type doping layer, disposed on said device substrate;
   a light emitting layer, disposed on said first-type doping layer;
   a second-type doping layer, disposed on said light emitting layer;
   a plurality of Ohmic-contact layers and a plurality of planarized buffer layers, disposed on said second-type doping layer, said Ohmic-contact layers and said planarized buffer layers being stacked together, said planarized buffer layers being configured for mending said Ohmic-contact layers;

a reflection layer, disposed on said stacked layers of said Ohmic-contact layers and said planarized buffer layers; and two electrodes, disposed on said reflection layer and said first-type doping layer, respectively.

14. The flip-chip packaged light emitting diode device of claim 13, wherein said light emitting diode device is connected electrically with said packaging substrate by means of a eutectic structure.

15. A light emitting diode device, comprising:
a device substrate;
a first-type doping layer, disposed on said device substrate;
a light emitting layer, disposed on said first-type doping layer;
a second-type doping layer, disposed on said light emitting layer;
a plurality of Ohmic-contact layers and a plurality of planarized buffer layers, disposed on said second-type doping layer, said Ohmic-contact layers and said planarized buffer layers being stacked together, said planarized buffer layers being configured for mending said Ohmic-contact layers;
a reflection layer, disposed on said stacked layers of Ohmic-contact layers and said planarized buffer layers, wherein a root-mean-square roughness of a surface between said planarized buffer layers and the reflection layer is less than a surface roughness of the ohmic-contact layers; and
two electrodes, disposed on said reflection layer and said first-type doping layer, respectively.

16. The light emitting diode device of claim 15, wherein said reflection layer has the effect of mirror reflection by means of said planarized buffer layer.

17. The light emitting diode device of claim 15, wherein said Ohmic-contact layers are metal thin films or metal-oxide layers.

18. The light emitting diode device of claim 15, wherein the light transmittance of said Ohmic-contact layers is greater than 90%.

19. The light emitting diode device of claim 15, wherein the thicknesses of said Ohmic-contact layers are smaller than 5000 angstroms.

20. The light emitting diode device of claim 15, wherein said planarized buffer layers are metal-oxide layers with light transmittance greater than 95%.

21. The light emitting diode device of claim 15, wherein the root-mean-square roughness of the surface between a planarized buffer layer and reflection layer is less than 20 angstroms.

22. The light emitting diode device of claim 15, wherein the thicknesses of the planarized buffer layers are between 500 and 5000 angstroms.

23. The light emitting diode device of claim 15, wherein said reflection layer is chosen from the group consisting of silver, gold, aluminum, and copper.

24. The light emitting diode device of claim 15 further comprising a cover layer disposed on said reflection layer and extending to the sidewall of said reflection layer.

25. A light emitting diode device, comprising:
a device substrate;
a first-type doping layer, disposed on said device substrate;
a light emitting layer, disposed on said first-type doping layer;
a second-type doping layer, disposed on said light emitting layer;
a plurality of Ohmic-contact layers and a plurality of planarized buffer layers disposed on said second-type doping layer, said Ohmic-contact layers and said planarized buffer layers being stacked together, said planarized buffer layers being configured for mending said Ohmic-contact layers;
a reflection layer, disposed on said stacked layers of Ohmic-contact layers and said planarized buffer layers, wherein a root-mean-square roughness of a surface between a planarized buffer layer and the reflection layer is less than a surface roughness of an Ohmic-contact layer; and
two electrodes, disposed on said reflection layer and said first-type doping layer, respectively.

26. The light emitting diode device of claim 25, wherein said reflection layer has the effect of mirror reflection by means of said planarized buffer layer.

27. The light emitting diode device of claim 25, wherein said Ohmic-contact a layers are metal thin films or metal oxide layers.

28. The light emitting diode device of claim 25, wherein the light transmittance of said Ohmic-contact layers is greater than 90%.

29. The light emitting diode device of claim 25, wherein the thicknesses of said Ohmic-contact layers are smaller than 5000 angstroms.

30. The light emitting diode device of claim 25, wherein said planarized buffer layer is a layers are metal-oxide layers with light transmittance greater than 95%.

31. The light emitting diode device of claim 25, wherein the root-mean-square roughness of the surface between a planarized buffer layer and reflection layer is less than 20 angstroms.

32. The light emitting diode device of claim 25, wherein the thicknesses of the planarized buffer layers are between 500 and 5000angstroms.

33. The light emitting diode device of claim 25, wherein said reflection layer is chosen from the group consisting of silver, gold, aluminum, and copper.

34. The light emitting diode device of claim 25 further comprising a cover layer disposed on said reflection layer and extending to the sidewall of said reflection layer.

\* \* \* \* \*